United States Patent [19]
Takahashi et al.

[11] Patent Number: 5,364,009
[45] Date of Patent: Nov. 15, 1994

[54] ULTRASONIC WIRE BONDING METHOD

[75] Inventors: Kuniyuki Takahashi, Musashimuryama; Tooru Mochida, Oume, both of Japan

[73] Assignee: Kabushiki Kaisha Shinkawa, Tokyo, Japan

[21] Appl. No.: 89,795

[22] Filed: Jul. 9, 1993

[51] Int. Cl.$^5$ .......................................... H01L 21/607
[52] U.S. Cl. .............................. 228/110.1; 228/180.5
[58] Field of Search .............. 228/180.5, 110.1, 1.1, 228/4.5, 103

[56] References Cited

U.S. PATENT DOCUMENTS 4,466,565  8/1994  Miyazima ............................ 228/1.1

FOREIGN PATENT DOCUMENTS 62-27741  6/1987  Japan ................................ 228/110.1

Primary Examiner—Samuel M. Heinrich
Attorney, Agent, or Firm—Koda and Androlia

[57] ABSTRACT

An ultrasonic wire bonding method that uses an ultrasonic oscillation output from a non-rotatable form, wherein the ultrasonic oscillation output used for bonding the leads that extend in an X-direction which is perpendicular to the axial direction of a horn is set to be larger than the ultrasonic oscillation output used for bonding the leads extending in a Y-direction which coincides with the axial direction of the horn.

2 Claims, 2 Drawing Sheets

ULTRASONIC WIRE BONDING METHOD

DETAILED DESCRIPTION OF THE INVENTION

1. Field of the Invention

The present invention relates to a method of wire bonding which uses ultrasonic waves solely or together with other means (collectively called "ultrasonic wire bonding" below).

2. Prior Art

In devices which perform ultrasonic wire bonding in the process of manufacturing, for example, semiconductor devices, a capillary is held at an end of a horn, and a wire is passed through this capillary. After a ball is formed at a tip end of the wire, the ball is bonded to the electrode of a semiconductor pellet. Afterward, the capillary is raised, moved in the X and Y directions and then lowered, so that the wire is bonded to one of the leads of a lead frame. After this, the capillary is raised again and a clamper is closed, thus the wire is cut from the attachment base at the bonding point of the lead. When the bonding to the electrode and lead is performed, an ultrasonic oscillation is outputted from the horn, so that the capillary is caused to undergo ultrasonic vibration. The direction of the ultrasonic vibration of the horn is the same as the axial direction of the horn.

The ultrasonic wire bonding device of the type described generally has a bonding head mounted on an XY table which is driven in the X and Y directions, and the horn installed on this bonding head is movable up and down but is not rotatable. On the other hand, there are devices having rotatable horns as disclosed in, for example, Japanese Patent Publication No. 62-27741.

In the ultrasonic wire bonding device with a nonrotatable horn, as shown in FIG. 4, when the electrodes 2 of a semiconductor pellet 1 and the leads 4 of a lead frame 3 are bonded by the wire 6 that passes through the capillary 5, the axial direction of the horn 7 is kept in the Y direction, and therefore, the direction of the ultrasonic vibration applied is also in the Y direction. In most of the cases, the tip end of each lead 4 is free and unstable. In addition, leads 4 extend in different directions. As a result, when the leads 4b and 4d which extend in the Y direction are bonded, the ultrasonic vibration applied thereto is in the same direction as that of the leads 4b and 4d, and the leads 4b and 4d will not move when the ultrasonic vibration is applied. To the contrary, when the leads 4a and 4c which extend in the X direction are bonded, the ends of the leads 4a and 4c can move when the ultrasonic vibration is applied because the direction of the ultrasonic vibration applied is perpendicular to the direction of extension of the leads 4a and 4c. This results in that the ultrasonic vibration is not well applied, and the strength of the bonding is weak.

If an ultrasonic wire bonding device that has a rotatable horn is used, bonding is performed by rotating the horn so that the axial direction of the horn always coincides with the direction of the leads 4. Thus, the problems described above would not occur. In such a device, however, it is necessary to use a horn rotating means. This tends to cause the apparatus to be more complicated and more expensive. Accordingly, ultrasonic wire bonding devices with non-rotatable horns are more generally used.

SUMMARY OF THE INVENTION

The object of the present invention is to provide an ultrasonic wire bonding method which can provide an even strength bonding for every lead via an ultrasonic wire bonding device that uses a non-rotatable horn.

The object of the present invention is accomplished by an ultrasonic wire bonding method that uses an ultrasonic oscillation output from a non-rotatable horn, and the feature of the method is that the ultrasonic oscillation output used for bonding the leads that extend in an X direction which is perpendicular to the axial direction of the horn is set to be larger than the ultrasonic oscillation output used for bonding the leads extending in a Y direction which coincides with the axial direction of the horn.

In the present invention, a larger ultrasonic oscillation output is used when leads extending in the X direction which is perpendicular to the axial direction of the horn are bonded than when the leads extending in the Y direction which coincides with the axial direction of the horn are bonded. Accordingly, bonding can be performed with an appropriate bonding strength for all the leads even if the ends of the leads extending in the X direction move. Accordingly, variation in the bonding strength with regard to the direction of extension of the leads is very small, and a uniform bonding quality is obtained.

DETAILED DESCRIPTION OF THE INVENTION

Figure 3:
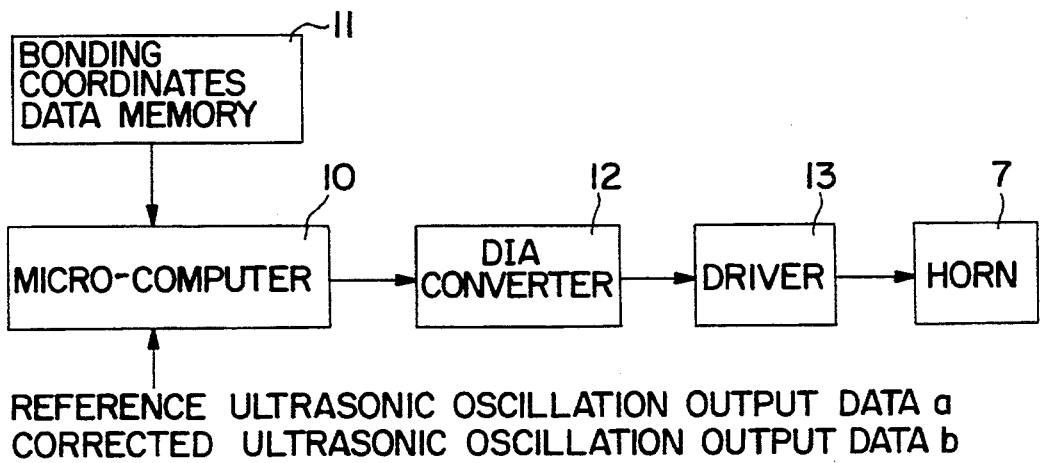
FIG. 3 is block diagram representing one example of a control circuit used in the method of the present invention.
Figure 4:
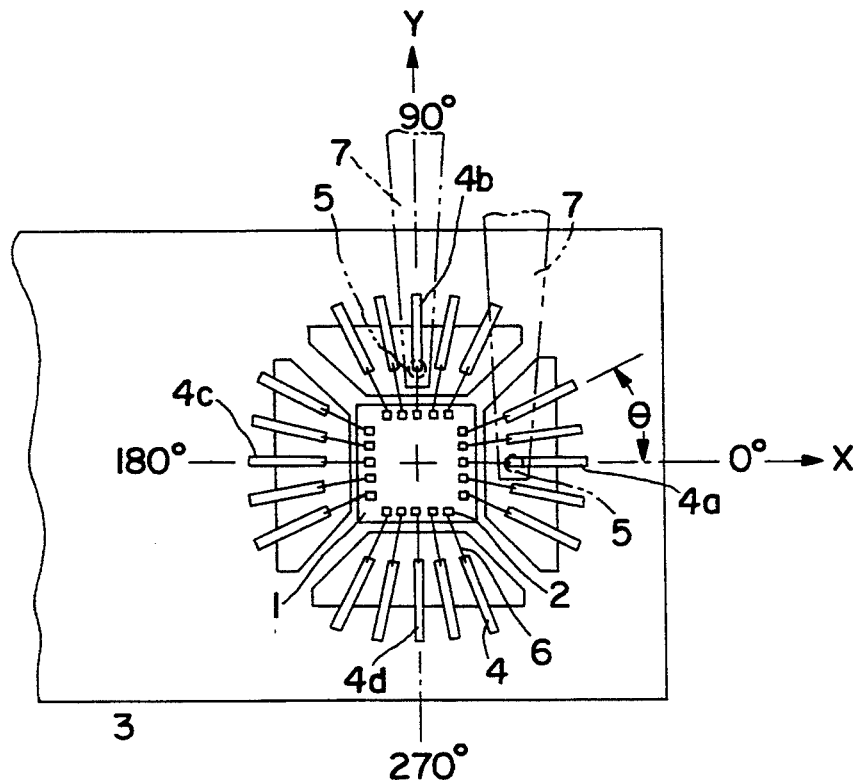
FIG. 4 is an explanatory top view showing an ultrasonic wire bonding method used in an ultrasonic wire bonding device with a non-rotatable horn.

Below, one embodiment of the present invention will be described with reference to FIGS. 1 and 3 and to FIG. 4 as well:

As shown in FIG. 3, a reference or standard ultrasonic oscillation output data a and correction ultrasonic oscillation output data b are stored in a microcomputer 10. The ultrasonic oscillation output b is used for corrections (of the ultrasonic oscillation output) based upon the angle $\theta$ of a lead which is to be bonded. The microcomputer 10 calculates the angle $\theta$ of the lead to be bonded from coordinate data which is read out from a bonding coordinate data memory 11 and outputs ultrasonic oscillation output data c that is obtained from Equation 1 below. The reference or standard ultrasonic oscillation output data a and the correction ultrasonic oscillation output data b in Equation 1 are predetermined by tests.

$$c = a + b \cdot \cos 2\theta$$

Figure 1:
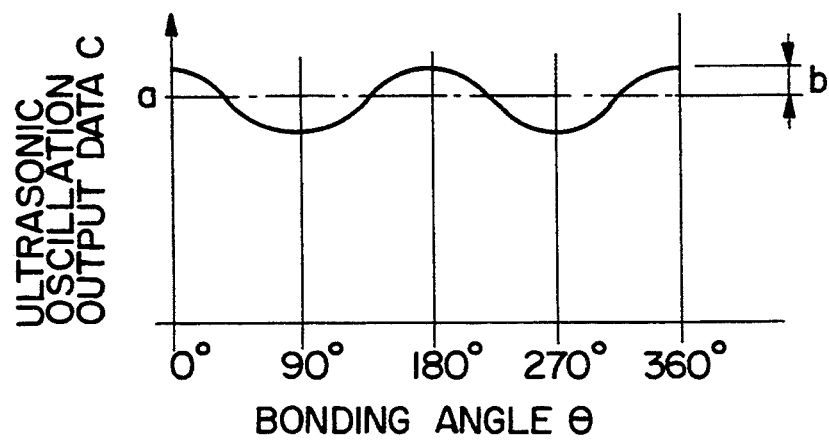
FIG. 1 is a diagram showing the relationship between the bonding angle of the leads and the ultrasonic oscillation output data according to one embodiment of the ultrasonic wire bonding method of the present invention.

The ultrasonic oscillation output data c has the waveform as shown in FIG. 1. More specifically, when bonding the lead 4a (where θ=0°) and the lead 4c (where θ=180°), the ultrasonic oscillation output data c which is equal to a+b is outputted. When the lead 4b (where θ=90°) and lead 4d (where θ=270°) are bonded, the ultrasonic oscillation output data c which is equal to a−b is outputted. This ultrasonic oscillation output data c is inputted into the horn 7 via a D/A converter 12 and driver 13. The horn 7 outputs an ultrasonic oscillation output which is proportional to the ultrasonic oscillation output data c, and the capillary 5 is caused to undergo ultrasonic vibration accordingly.

As seen from the above, the ultrasonic oscillation output data c used for bonding the leads 4a and 4c which are oriented in the X direction (that is, θ=0° and 180°, respectively) is equal to the value of a+b, while the ultrasonic oscillation output data c used for bonding the leads 4b and 4d which are oriented in the Y direction (that is, θ=90° and 270°, respectively) is equal to a−b. Thus, the ultrasonic oscillation output data c used for the leads 4a and 4c is greater than the ultrasonic oscillation output data c used for the leads 4b and 4d by an amount equal to 2b. As a result, bonding to the leads 4a and 4c can be performed with an appropriate pressure bonding strength even if the ends of the leads 4a and 4c move. Accordingly, variation in the bonding strength which is derived from the direction of the leads would not occur, and uniform bonding is accomplished. Furthermore, since the correction of the ultrasonic oscillation output data c is executed automatically by the microcomputer 10 in accordance with the angle θ of the lead 4, the method of the present invention is superior in terms of productivity.

Figure 2:
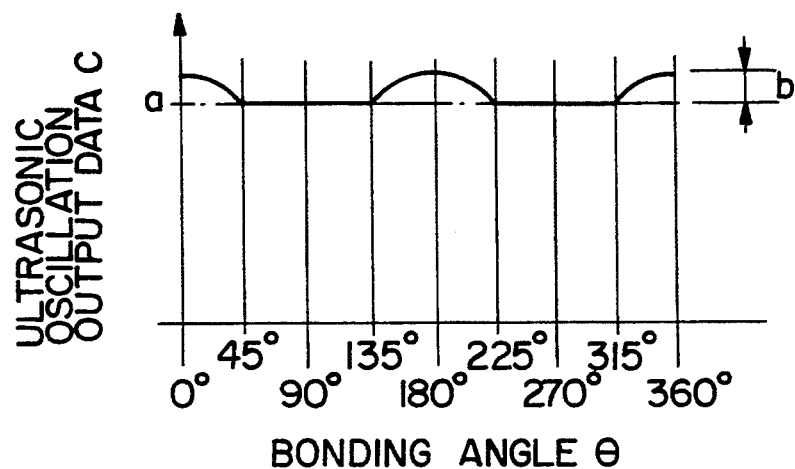
FIG. 2 is a diagram showing the relationship between the bonding angle of the leads and the ultrasonic oscillation output data according to another embodiment of the present invention.

FIG. 2 illustrates another embodiment of the present invention. In the method illustrated in FIG. 1, correction of the ultrasonic oscillation output data c was performed throughout a 360-degree range. In this embodiment of FIG. 2, on the other hand, correction based upon Equation 1 is executed only when θ=0° to 45°, 135° to 225°, and 315° to 360°, and the constant reference or standard ultrasonic oscillation output data a is outputted when θ=45° to 135° and 225° to 315°. In this method as well, the leads 4a and 4c oriented in the X direction are bonded by an output based on the correcting ultrasonic oscillation output data b which is greater than the output for the leads 4b and 4d oriented in the Y direction. Accordingly, the bonding strength of the leads 4a and 4c oriented in the X direction can be improved.

In the present invention, the ultrasonic oscillation output for bonding the leads extending in the X direction which is perpendicular to the axial direction of the horn is set larger than the ultrasonic oscillation output used for bonding the leads extending in the Y direction which coincides with the axial direction of the horn. Accordingly, uniform bonding strength is obtained for all the leads with the use of a non-rotatable horn in an ultrasonic wire bonding device.

We claim:

1. An ultrasonic wire bonding method in which bonding is performed by an ultrasonic vibration applied to a capillary via an ultrasonic oscillation output which is outputted from a horn that is not rotatable, said method being characterized in that bonding to .leads extending in an X direction which is perpendicular to an axial direction of said horn is performed by an ultrasonic oscillation output which is larger than an ultrasonic oscillation output used for bonding leads extending in a Y direction which coincides with the axial direction of said horn.

2. An ultrasonic wire bonding method according to claim 1 characterized in that said ultrasonic oscillation output is automatically calculated from a bonding angle of a lead and a correction range in which said ultrasonic oscillation output is corrected.

* * * * *

UNITED STATES PATENT AND TRADEMARK OFFICE
CERTIFICATE OF CORRECTION

PATENT NO. : 5,364,009
DATED : November 15, 1994
INVENTOR(S) : Kuniyuki Takahashi et al.

It is certified that error appears in the above-identified patent and that said Letters Patent is hereby corrected as shown below:

On the title page,
Item [75] Inventors:  Change "Kuniyuki Takahashi, Musashimuryama; Tooru Mochida, Oume, both of Japan" to --Kuniyuki Takahashi, Musashimurayama; Tooru Mochida, Oume, both of Japan--

Signed and Sealed this

Seventeenth Day of January, 1995

Attest:

BRUCE LEHMAN

*Attesting Officer*          *Commissioner of Patents and Trademarks*